United States Patent [19]
Shen

[11] Patent Number: 5,946,697
[45] Date of Patent: Aug. 31, 1999

[54] RAPID TRANSFER OF HTML FILES

[75] Inventor: Shioupyn Shen, Milpitas, Calif.

[73] Assignee: Microsoft Corporation, Redmond, Wash.

[21] Appl. No.: 08/844,773

[22] Filed: Apr. 22, 1997

[51] Int. Cl.⁶ .................................................. G06F 17/30
[52] U.S. Cl. ......................................... 707/104; 709/218
[58] Field of Search .............................. 707/2, 4, 10, 30, 707/104, 101, 100; 395/200.48, 200.49, 182.11, 200.33; 364/280, 282.1, 283.1; 709/218, 219

[56] References Cited

U.S. PATENT DOCUMENTS

| | | | |
|---|---|---|---|
| 5,168,444 | 12/1992 | Cukor et al. | 705/1 |
| 5,218,696 | 6/1993 | Baird | 707/1 |
| 5,274,805 | 12/1993 | Ferguson | 707/1 |
| 5,715,453 | 2/1998 | Stewart | 707/104 |
| 5,737,592 | 4/1998 | Nguyen et al. | 707/4 |
| 5,793,966 | 8/1998 | Amstein et al. | 395/200.33 |
| 5,802,520 | 9/1998 | Jerkunica et al. | 707/101 |

*Primary Examiner*—Zarni Maung
*Assistant Examiner*—Khanh Quang Dinh
*Attorney, Agent, or Firm*—Ronald M. Anderson

[57] ABSTRACT

A compressed file produced by a server is used for updating a hypertext markup language (HTML) document cached on a client computer with changes so that it is identical to a changed HTML document stored on a server computer. Typically, when a user requests access to the HTML document on a server computer corresponding to the cached HTML document on the client computer, the cached HTML document is opened and processed by a client agent software module to produce a macro name file and a macro definition file. A checksum or macro name is determined for each construct or list in the cached HTML file. Each macro definition in the macro definition file is a concise content of the construct or list comprising a different portion of the HTML file. The client agent transmits the uniform resource locator (URL) for the site from which the cached HTML document was obtained and appends the macro name file (assuming that the server computer hasn't already generated the macro name file). A server agent at the server site produces a macro compressed file in which the macro name for each section that is unchanged is included, along with the actual contents of those constructs or lists in the HTML file stored on the server computer that have changed. The macro compressed file is transmitted back to the client agent for expansion and to refresh the HTML file that is cached on the client computer. The updated HTML file can then be displayed using the browser on the client computer.

20 Claims, 3 Drawing Sheets ately, there is no
provision for splitting up an HTML file so that only the
portion that has changed since the file was last cached is
transferred from the server to the client.

RAPID TRANSFER OF HTML FILES

FIELD OF THE INVENTION

The present invention generally relates to the transfer of information over a network, and more specifically, to the transfer of hierarchically structured files, such as hypertext markup language (HTML) files, over a network to a recipient computer on which the files are cached.

BACKGROUND OF THE INVENTION

Ready access to a multitude of World Wide Web (WWW) sites over the Internet has resulted in an astonishing growth in the amount of traffic and is likely to cause increasing delays in the transfer of data between servers and the client computers accessing them. This problem is particularly troubling to those using relatively slow modems to access the web. High speed access is often not readily available when the Web is being accessed from a personal data assistant or other small, portable computing device. Furthermore, even though higher speed modems are available for use by conventional computers, many slower modems remain in use. Clearly, a technique for increasing the efficiency with which HTML documents are transferred over the Internet (and over other networks) by slower speed devices would improve the effective data transfer rate, thereby benefiting all users of the network.

To better appreciate how data transfer efficiency might be improved on the Internet, it is helpful to understand the nature of the Web page documents being transferred. The HTML language is used for writing hypertext documents. These documents are more formally referred to as Standard Generalized Markup Language (SGML) documents and they conform to a particular Document Type Definition (DTD). An HTML document includes a hierarchical set of markup elements. Most elements have a start tag, followed by content, followed by an end tag. The content is a combination of text and nested markup elements. Tags indicate how the document is structured and how to display the document, as well as destinations and labels for hypertext links. There are tags for markup elements such as titles and headers, text attributes such as bold and italic, lists, paragraph boundaries, links to other documents or other parts of the same document, and in-line graphic images. The HTML language also enables an HTML document to include images that are stored as separate files. When the user views the HTML document, any included image is displayed as part of the document, at the point where the image element occurred in the document.

Although HTML files may include graphics, text in such files is more likely to change in a dynamic fashion. One solution to this problem is to store or "cache" HTML files that were previously transferred from the server computers, so that the next time the user connects to a site recently visited, the HTML file defining a web page for that Uniform Resource Locator (URL) site can be loaded into the client computer display from the cache stored on the client hard drive instead of being transferred over the Internet. The user perceives a much faster loading of a page from a cache, and less data need to be transferred over the Internet. However, under conventional procedures, if any change in the text content of an HTML file has occurred since the user last connected to a URL site, the cached file on the client hard drive will normally be discarded, and the entire revised HTML will be transferred from the server to the client computer. The user must wait for the transfer to complete before all of the content of the HTML file is fully visible.

The server and the browser software used by the client typically cooperate to detect whether it will be necessary to transfer a new HTML file from the server to the client computer or whether a cached HTML file stored on the client computer can instead be used. Currently, there is no provision for splitting up an HTML file so that only the portion that has changed since the file was last cached is transferred from the server to the client.

To minimize the amount of data that must be transferred over the Internet in order to display an HTML file, it would be desirable to provide a mechanism for dividing an HTML file into a plurality of units, so that only those units that have changed must be transferred to synchronize the cached HTML file data on the client computer with that stored on the server. Furthermore, in those cases where it is necessary to avoid the need to modify existing web browser or web site server software, this mechanism should occur in a manner that is transparent to the server and browser software. By avoiding the need to modify server and web browser software so as to accomplish this objective, it should be possible to effect the desired result independent of the server and web browser software programs used to access the HTML files. However, as new browser and web site server software is developed, it would be preferable to integrate this approach into the respective software so that it operates more efficiently. By providing a method for transferring primarily the changed portions of an HTML file, a substantial improvement in the data transfer rate for web sites that have previously been accessed can be achieved when the sites are again accessed. The result will improve the apparent speed at which the HTML file for each such site is displayed on the client computer and greatly reduce the amount of data transferred over the net. Further, it will be apparent that this technique can be used when transferring an HTML file over almost any type of network, including local area and wide area networks and on intranets, between any two points that are connected, such as between two sites on a wide area network.

SUMMARY OF THE INVENTION

The present system for rapidly transferring files includes four operative components—a web browser, a client agent, a server agent, and a web server. The communication between the web browser and the client agent is fast. Similarly, the communication between the web server and server agent is also fast. However, the link between the client agent and server agent is relatively slow, being limited by the speed of a modem or data link coupling the client agent to the server agent. The present invention compensates for the slow data transfer rate over this link. Each component can be run in a different computer or can be executed with another component on the same computer. For example, the web browser and client agent are very likely to be executed on the same client computer. The server agent can be executed in the proxy server or combined with the web server for execution on the server computer.

In accord with the present invention, a method is defined for transferring changes to synchronize an HTML file cached at a client location with a corresponding changed HTML file stored at a server location. The method enables the changed HTML file stored at the server location to be used at the client location without transmitting all of the changed HTML file to the client location and includes the step of extracting a macro name file and a macro definition file from the HTML file cached at the client location. The macro definition file includes a definition that defines a content of at least a portion of the HTML file, and the macro name file includes a macro name associated with each such definition. In the next step of the method, the macro name file is transmitted from the client location to the server location. However, if the macro name file is already available at the server location, it need not be transmitted. A macro compressed file is generated at the server location from the changed HTML file, using the macro name file. This macro compressed file indicates changes made to the changed HTML file relative to the HTML file cached at the client location and includes the macro name for each portion of the changed HTML file that is identical to a corresponding portion of the HTML file cached at the client location. The macro compressed file is transmitted to the client location from the server location. The macro compressed file is expanded at the client location to recover the changes and to identify any portion of the changed HTML file that is identical to the HTML file cached at the client location. These changes are applied to the HTML file cached at the client location to make a new cached HTML file that is substantially identical to the changed HTML file stored at the server location.

Preferably, the method further comprises the step of using the new cached HTML file to produce a display at the client location. Like a list processing (LISP) language program, the HTML file cached at the client location comprises a plurality of lists. Each list represents one portion of the cached file and has a checksum associated with it that comprises the macro name for the list. The macro definition file includes a macro definition for each list that concisely defines a content for each list. Further, the macro definition file comprises an idiom dictionary that defines the lists for the HTML file cached at the client location. In addition, the method includes the step of providing a client agent at the client location to extract the macro definition file and the macro name file. This client agent responds to a request entered by a user at the client location to access a URL for a site corresponding to that from which the HTML file cached at the client location was obtained, by appending the macro name file for the HTML file after a URL address for the site. Also, the client agent expands the macro compressed file that is received from the server location. The client agent expands the macro compressed file by replacing macro names included in the macro compressed file with a corresponding content determined from the macro definition file. The new HTML file is preferably passed to a web browser for use in the display at the client location.

Another aspect of the present invention is directed to a system for updating an HTML file disposed at a first location so that it is substantially identical to a changed HTML file disposed at a second location, without transmitting all of the changed HTML file to the first location from the second location. The system implements functions generally consistent with the steps of the method discussed above.

Still another aspect of the present invention is directed to articles of manufacture that include a memory medium adapted to be read by a computer. The memory medium stores machine instructions, which when executed by the server computer and the client computer, cause those computers to implement functions that are generally consistent with the steps of the method discussed above.

BRIEF DESCRIPTION OF THE DRAWING FIGURES

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figures 1, 2:
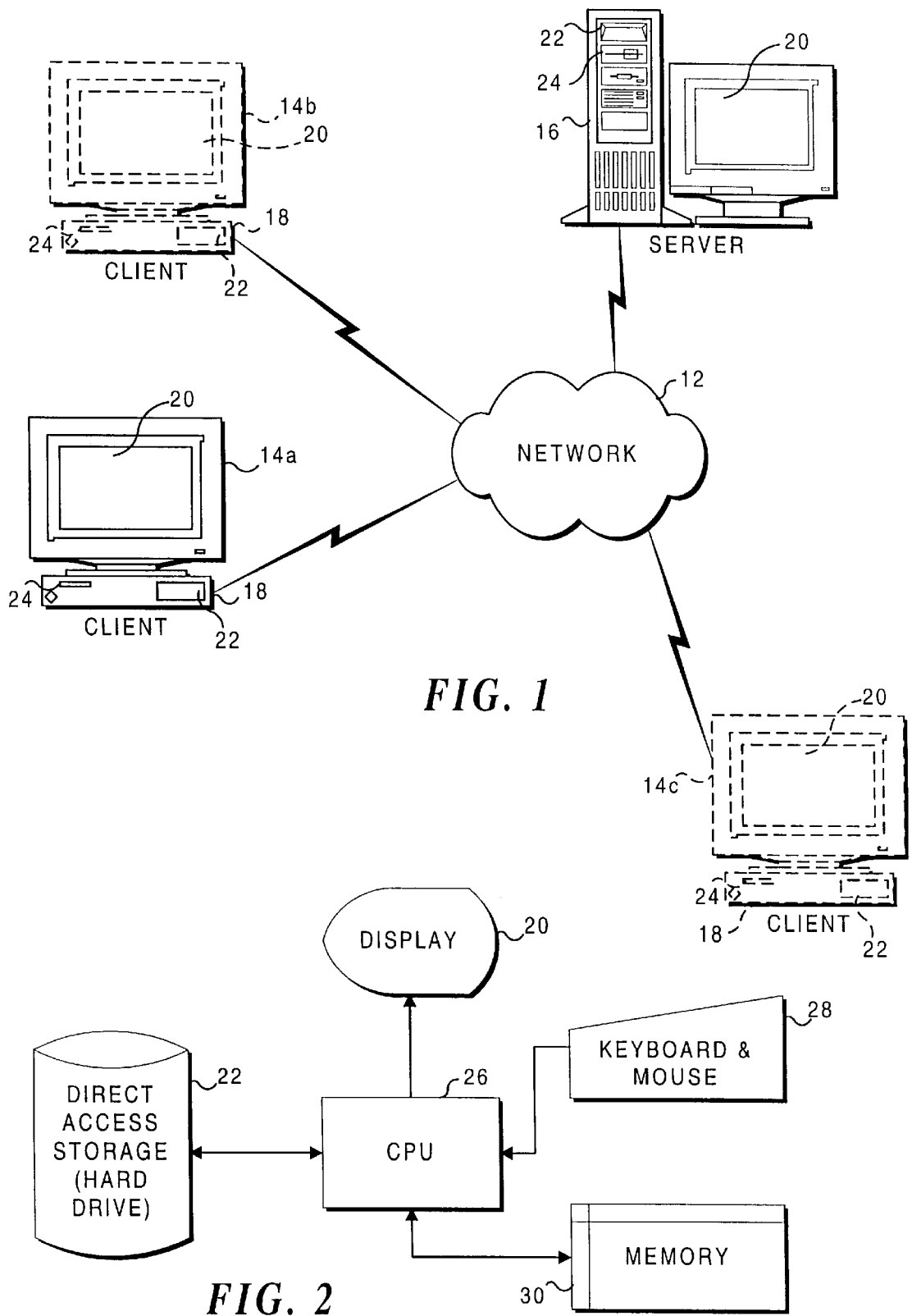
FIG. 1 is a schematic block diagram showing a server computer and several client computers communicating over a network, such as the Internet.
FIG. 2 is a schematic block diagram of the internal components of a digital computer on which the present invention is implemented when communicating over the Internet and is applicable to either a server or a client computer.

FIG. 1 schematically illustrates a network 12 that includes three client computers 14a, 14b, and 14c that are communicating through the network to a server computer 16. Although many more client computers may be coupled to server computer 16 through the network, for simplification of the drawing and this discussion, only three client computers are illustrated, and two of these are shown in phantom view to make clear that the present invention arises in connection with communication between one client computer and the server computer. Network 12 may comprise the Internet, a local area network, a wide area network, or virtually any other type of network in which client and servers communicate using HTML documents. The present invention is particularly applicable to the Internet and to intranet networks, since it facilitates communication of HTML documents from the server to the client computer in order to update an HTML document that was previously transferred from the server and is now stored on the client computer.

As noted in the Background of the Invention, an object of the present invention is to minimize the total amount of data communicated from server 16 to any of the client computers requesting an HTML document from the server by making greater use of the data for the HTML document that is cached on the client computer than is currently done. Each client computer is generally conventional in its design, and may comprise a desktop computer, a workstation, a laptop or portable computer, or any other suitable digital computer having storage capacity for caching HTML documents and an interface for coupling to the server over a network.

With reference to FIG. 1, each client computer includes a processor chassis 18 in which may be disposed a hard drive 22 and/or a floppy drive 24. Generally, hard drive 22 will be used for nonvolatile storage of application programs and data, including the caching of HTML document data in connection with the present invention. It is contemplated that the client computer may be a network workstation that does not include a hard drive or may be a portable device such as a PDA that does not include either a hard drive or a floppy. Each client computer will likely include a monitor or display screen 20 on which HTML documents can be displayed and presented to the user of the client computer.

Similarly, server computer 16 includes a hard drive 22 and may include a floppy drive 24. Typically, the nonvolatile storage capacity of hard drive 22 on server computer 16 is substantially greater than that of the hard drives on the client computers that are linked to the server. However, it is also contemplated that a device such as a router, which performs the function of a server computer, can be used and such a device may not include a hard drive; because it accesses data stored on a different device. Server computer 16 may optionally include a monitor or display screen 20, but typically does not.

The link between each of the client computers and the server computer will be through any of the links typically used for connecting digital computers in a network, such as telephone or data lines. In any case, the details employed in linking the client computers to the server computer in network 12 are of little consequence in connection with the present invention.

As shown in FIG. 2, the digital computer used for either the client computer or the server computer includes a central processing unit (CPU) 26 that is bidirectionally coupled to hard drive 22 to store or access previously stored application programs and/or data. CPU 26 is also coupled to display 20. Although not shown, an appropriate video interface and appropriate video driver software are used to enable the CPU to render graphics and other aspects of an HTML document on display 20. A keyboard and mouse 28 are connected to CPU 26 to provide user input to applications running on the computer. Either the keyboard or the mouse can be employed by the user to provide an input to CPU 26 that initiates connection of the client computer to a specific site at which server computer 16 is disposed, in order to access an HTML document stored on hard drive 22 of server computer 16. The document is referenced by the URL of the site of the server computer and by the document HTML file name.

Application programs such as an Internet browser are stored on hard drive 22 in the form of machine language instructions. When the user wants to connect to the Internet, e.g., using a dial-up service provider or by some other means (not shown), the user will typically run the Internet browser program, such as Microsoft Corporation's Internet Explorer™. The machine instructions defining the Internet browser program are loaded from hard drive 22 into a memory 30 for access by CPU 26. Memory 30 includes both volatile random access memory (RAM) and read only memory (ROM). The ROM portion of memory 30 is used during boot-up of the computer to establish the basic input/output capabilities of the system, and the RAM portion stores the machine instructions and other data of a temporary nature that are used by CPU 26 in effecting the functions implemented when the application is run on the computer. Similarly, the present invention comprises a set of machine instructions that define the functions implemented by CPU 26. The machine instructions implemented by the client computer for the present invention initiate a client agent to effect the rapid updating of an HTML file that is cached on hard drive 22 in the client computer when a user selectively accesses a site from which the HTML file was previously downloaded. Similarly, at the server computer, machine instructions are loaded into memory that enable the server computer to function as a web server and in connection with the present invention, to provide a server agent by running the instructions.

Each site on the Internet is identified by a unique URL that enables it to be found so that the client computer is coupled to the server computer at that site to access one or more HTML documents stored on the hard drive of the server computer. Similar techniques are used in connection with intranets to access a specific HTML document, which might be stored on one of several different intranet server computers. Furthermore, it should be noted that the present invention can be used on two computers that are linked together by any communication medium, which may not require that the source of the HTML document be identified.

On client computer 14a, the client agent implements the functions described below that enable HTML files cached on the client computer to be updated with data from server computer 16. Similarly, on server computer 16, the server agent implements the functions described below that are required on the server side of the system.

Figure 3:
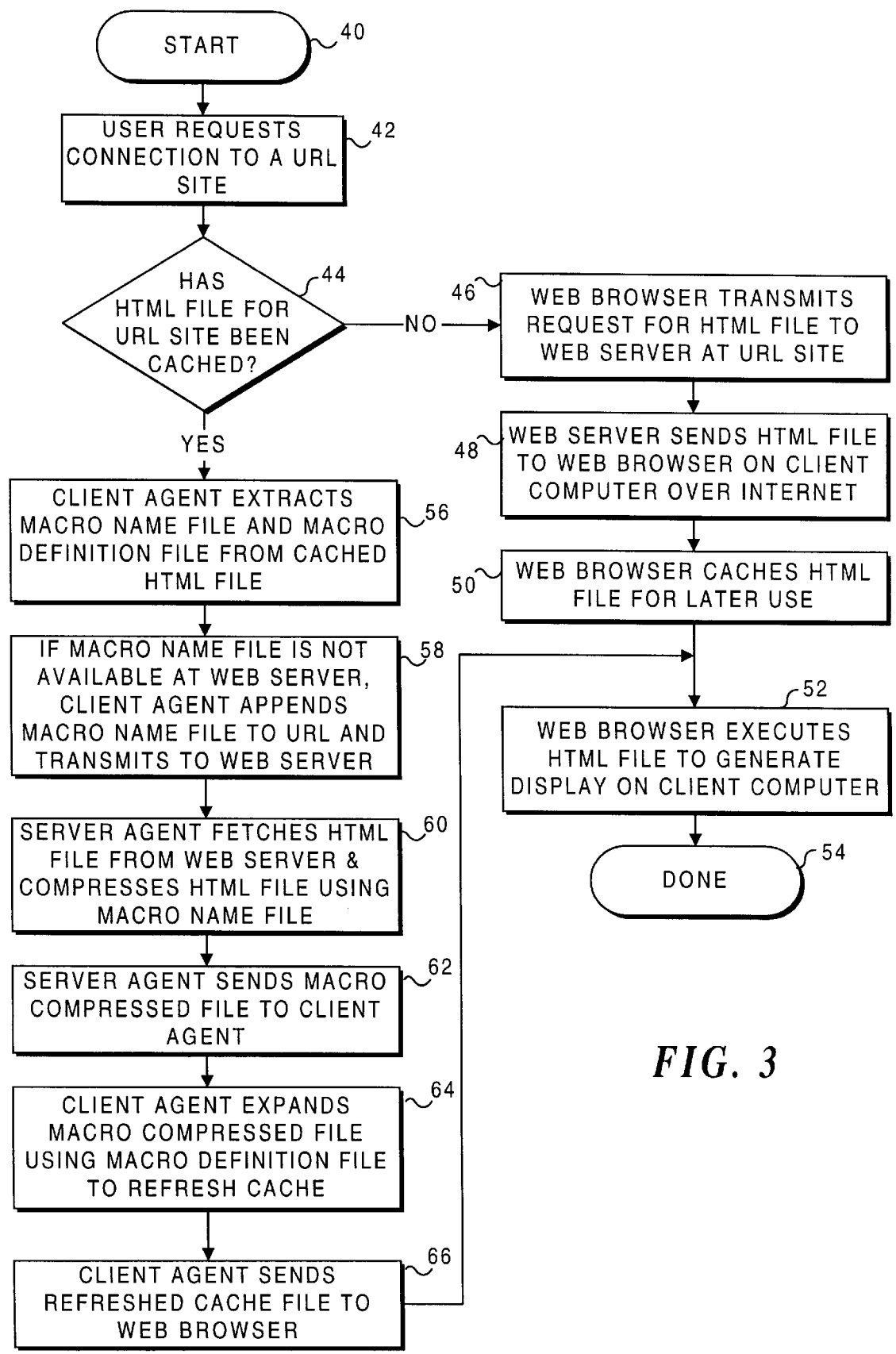
FIG. 3 is a flow chart showing the overall steps of the present method for rapidly updating a cached HTML file stored on a client computer using a macro compressed file that is transmitted from the server to the client.

In FIG. 3, the steps required for updating an HTML file cached on the client computer and stored on hard drive 22 are illustrated in a flow chart. The flow chart begins with a start block 40 and continues in a block 42 in which the user requests connection to a URL site. Generally, this request is made by entering the URL identifier for the site in a web browser, or selecting the site from among a number of sites that are stored as bookmarks for access by the web browser. Examples of browsers that include this capability are Microsoft Corporation's Internet Explorer™, and Netscape Corporation's Navigator™ web browsers. In response to the request entered in the browser in block 42, a decision block 44 determines if an HTML file for that URL site has been cached or stored on hard drive 22. If the site was recently visited by the user and the HTML file was then transferred from the server computer at the site to the client computer, the HTML file will likely still be cached on the client computer hard drive. If not, a block 46 indicates that the web browser transmits the request for the HTML file to the web server at the URL site. The request transmitted by the browser is sent over the Internet (or other type of network) to the appropriate server, which responds as indicated in a block 48 by sending the entire requested HTML file to the web browser running on the client computer. Since the HTML file was not cached on the client computer when requested by the user, the web browser stores the HTML file for later use in a cache folder on the hard drive and proceeds to a block 52 in which the web browser executes the HTML file to render the document on the display of the client computer.

Those familiar with HTML documents will appreciate that such a web document may include one or more hypertext links to other web sites, animations running under ActiveX™ or Java™, forms, sound clips, and various other components. New features are being developed for inclusion in HTML documents at a rapid pace. As more features are added, the complexity and the amount of data comprising an HTML file increases proportionally. Accordingly, the present invention is particularly useful in that it enables a substantially smaller amount of data to be transmitted to update a cached HTML file when changes occur in the HTML file on the server computer that are not included in the HTML file cached on the client computer.

The next time that the user requests a connection to the same URL site to access the HTML file stored there, decision block 44 determines that the HTML file for that site has been cached on hard drive 22 of the client computer. In response to this determination, the client agent extracts a macro name file and a macro definition file from the cached HTML file, as noted in a block 56. This step is a key aspect of the present invention and further explanation is required to clearly describe it.

To understand how the present invention enables an HTML file cached on the client computer to be rapidly updated, it is first necessary to understand that HTML files are structured files, having an explicit beginning and end for most of the constructs or components comprising the file. As noted above, the specification defining HTML files is not fixed, but continues to expand as new features and functionality are added. Because of their structure, HTML files can be modeled in a way similar to LISP programs, which also have explicit beginning and ends for each of the constructs comprising them. Each construct in an HTML file comprises a list that is enclosed by an open parenthesis and a close parenthesis. These lists can be nested, but not interleaved. The technique for accelerating the updating of HTML files applies a technique that is analogous to the methods used for LISP file synchronization, but the technique is applied in an entirely different manner and for a very different purpose.

Figure 4:
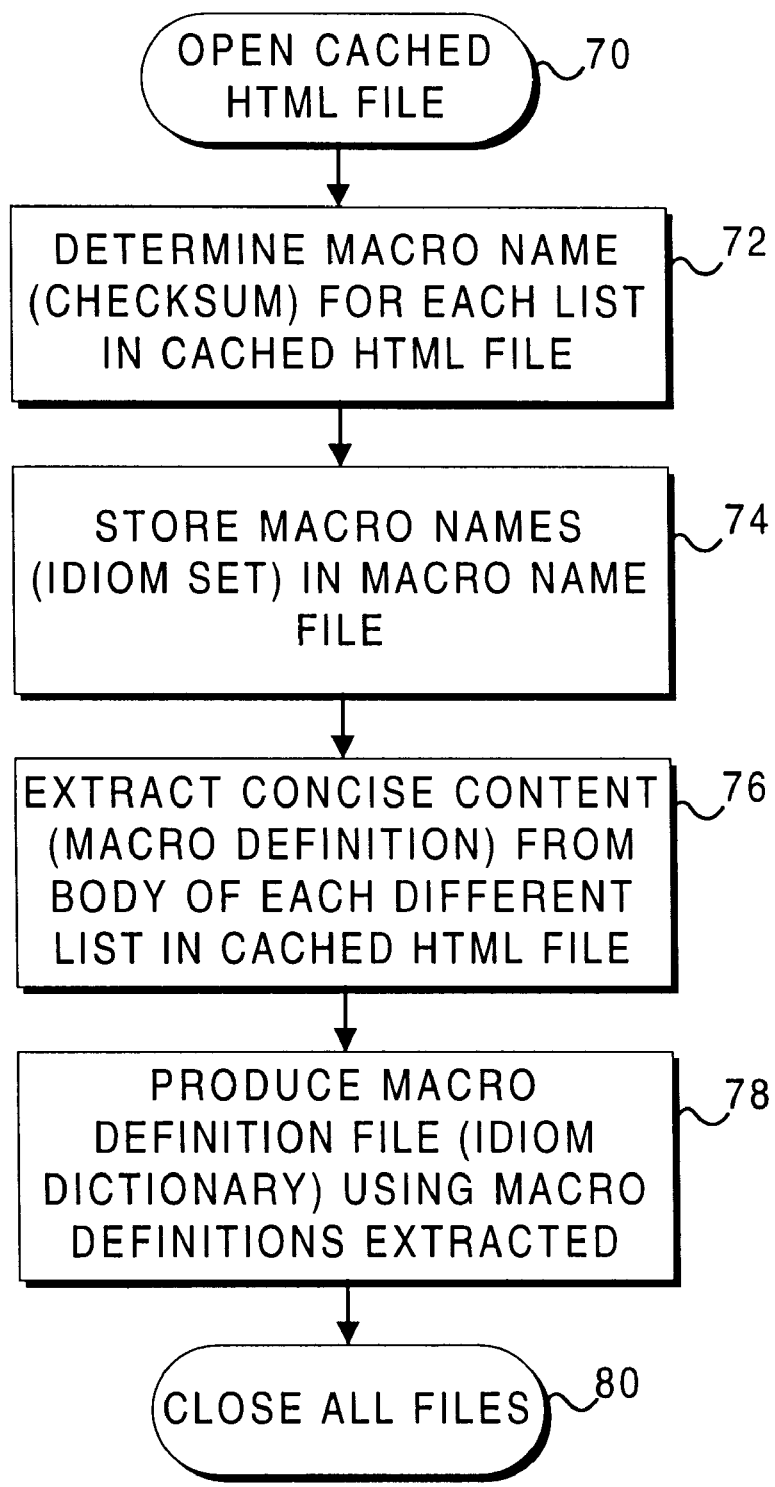
FIG. 4 is a flow chart illustrating the steps used to produce the macro name file and the macro definition file from the cached HTML file.

Details of the steps referenced in block 56 from FIG. 3 are illustrated in the flow chart shown in FIG. 4. Turning now to FIG. 4, a block 70 indicates that a cached HTML file (on the client computer) is opened. The client computer then determines a macro name for each construct or list in the cached HTML file. While it might be possible to use other schemes to identify each construct, it is important that the method used to determine the macro name be consistent and readily accomplished. For this reason, the preferred embodiment of the present invention determines a macro name that is equal to a checksum for each construct or list in the cached HTML file. In connection with an HTML document, each construct may comprise a different section of text, a graphic image, a Visual Basic script or Java script component, a form, or virtually any other discrete portion of the HTML document. The present invention is applicable to the Visual Basic script and Java script components, which may be rather large, because these components have a hierarchical structure, i.e., nested begin-end structures. Since each construct or list is defined and represented in the document by alphanumeric characters, a checksum of those characters for each list can be determined for use as the macro name. A conventional approach well known to those of ordinary skill in the art is used to determine the checksum. It is extremely unlikely that any two different constructs in a given HTML document would have identical checksums, so that each macro name is generally unique and corresponds to a different construct in the document.

In a block 74, the macro names for the cached HTML document are stored in a macro name file in the same sequence that the lists or constructs to which they correspond appear within the HTML document. These macro names comprise an idiom set for the document. In a macro definition, each sub-construct is represented by its macro name. A parent construct may include a plurality of child constructs, and each has its own macro name in the macro definition file. It should be apparent that the macro name file identifies each construct or list in the HTML file and that the checksums comprising the macro names in the macro name file are substantially smaller in size than the constructs or lists that the macro names represent and correspond to. Accordingly, the macro name file for a document is much smaller in size than the data required to store the original HTML document.

Corresponding to each macro name in the macro name file are macro definitions. A macro definition is simply the content of that portion of the body of the cached HTML file represented by a macro name. Thus, there is a direct correspondence between each macro name and the macro definition or portion of the HTML file represented by the macro name. In a block 76, the macro definitions are extracted from the body of HTML file for each different construct or list. Finally, in a block 78, a macro definition file comprising the idiom dictionary is produced using the macro definitions that were extracted. In a block 80, all of the files are closed.

Returning back to FIG. 3, in a block 58, the client agent appends the macro name file to the URL for the site at which the cached HTML file is stored and transmits it to the web server at that site, over the network. The existence of the client agent and its actions in producing the macro name file and macro definition file are completely transparent to the web browser, which need not be modified in any way to implement the present invention. The client agent simply responds to the request made by the user to access a web document using the web browser by insuring that the macro name file for any HTML file being requested is appended to the URL that is transmitted over the network from the client computer to the server computer. However, as noted above, it may be desirable to integrate the client agent into the program that implements the web browser. Also, in certain applications of the present invention in which two end points are coupled together in a communication link, it may not be necessary to provide a URL for the storage site of the HTML file. It is further contemplated that the server computer may have already produced the macro name file for the HTML file cached by the client computer, e.g., when the file was originally transmitted to the client computer. If so, it will not be necessary for the client computer to send the macro name file to the server computer.

In a block 60, the server agent, which is executed on the server computer, fetches the HTML file that was requested by the URL from the hard drive on the web server computer where it is stored and compresses the HTML file using the macro name file supplied by the client agent. The step implemented in block 60 produces a compressed file from the HTML file that was obtained from the server. The compressed file is produced by replacing each construct in the HTML file with the macro name that represents it, if the macro name is also found in the macro name file received from the client computer. If a construct in the HTML file that is obtained from the server hard drive is not represented by a macro name in the macro name file received from the client computer, then that construct or list is inserted into the compressed file. If a parent construct does not match in the changed HTML file, then as many child constructs for that portion of the HTML file will be used as possible. The compressed file thus uses the macro names provided by the client computer to represent the constructs or lists that are already in the cached HTML file on the client computer. The order in which the macro names are inserted into the compressed file may be different than their order in the HTML file cached on the client computer. Only those portions of the HTML files stored on the server computer that have changed relative to the HTML file cached by the client computer must be transmitted in full back to the client computer.

If the HTML file stored on the server computer is identical to that cached by the client computer, the compressed file produced by the server agent will include only the macro names received from the client agent. More typically, the compressed file will comprise the macro names for the portions of the HTML files stored on the server computer that have not changed interspersed with the full constructs or lists for those sections of the HTML file that have changed. It will be apparent that the size of the compressed file will become larger as a function of the differences between the HTML file stored on the server computer and that cached by the client computer, i.e., the more changes that have occurred, the larger will be the compressed file. If no change has occurred in the HTML file, the compressed file could include simply the macro name representing the text for the entire HTML file as one construct.

In a block 62, the server agent transmits the macro compressed file to the client agent over the network. Since the compressed file is substantially smaller in size than the complete HTML file stored on the server, a significant reduction in the amount of data transmitted from the server computer to the client computer is accomplished compared to the data that would be transmitted without benefit of the present invention.

The compressed file is thus received by the client agent for further processing to recover the HTML file in its entirety. In a block 64, the client agent expands the macro compressed file using the macro definition file previously produced to refresh the cache of the HTML document. This step makes the cached HTML document identical to the HTML document stored on the server. In this step, each macro name appearing in the macro compressed file is replaced by its corresponding macro definition, maintaining the order in which macro names and full constructs or lists appear in the compressed file.

In a block 66, the client agent sends the refreshed cache file to the web browser. The web browser, as indicated in block 52, executes the refreshed HTML file to generate the display on the client computer, which now corresponds to the HTML document stored on the server computer. The process is thus completed in a block 54.

Since relatively less data need be transmitted from the server computer to the client computer to update the HTML document that is cached on the client computer, the refreshed HTML file is displayed on the client computer much more rapidly than otherwise would be possible. In addition, since less data are transmitted over the network, the net benefit of using this technique for refreshing the HTML documents stored on a number of different client computers will be an increase in the efficiency web sites are accessed over the network.

Although the present invention has been described in connection with the preferred form of practicing it, those of ordinary skill in the art will understand that many modifications can be made thereto within the scope of the claims that follow. Accordingly, it is not intended that the scope of the invention in any way be limited by the above description, but instead be determined entirely by reference to the claims that follow.

The invention in which an exclusive right is claimed is defined by the following:

1. A method for synchronizing a hypertext markup language (HTML) file cached at a client location with a corresponding changed HTML file stored at a server location to enable the changed HTML file stored at the server location to be used at the client location without transmitting all of the changed HTML file to the client location, comprising the steps of:

(a) extracting a macro name file and a macro definition file from the HTML file cached at the client location, said macro definition file including a definition that defines a content of at least a portion of the HTML file, and said macro name file including a macro name associated with each said definition;

(b) unless the macro name file is already available at the server location, transmitting the macro name file from the client location to the server location;

(c) generating a macro compressed file from the changed HTML file using the macro name file at the server location, said macro compressed file indicating changes made to the changed HTML file relative to the HTML file cached at the client location and including the macro name for each portion of the changed HTML file that is identical to a corresponding portion of the HTML file cached at the client location;

(d) transmitting the macro compressed file to the client location from the server location; and (e) expanding the macro compressed file at the client location to recover the changes and to identify any portion of the changed HTML file that is identical to the HTML file cached at the client location, said changes being applied to the HTML file cached at the client location to make a new cached HTML file that is substantially identical to the changed HTML file at the server location.

2. The method of claim 1, further comprising the step of using the new cached HTML file to render a display at the client location.

3. The method of claim 1, wherein the HTML file cached at the client location comprises a plurality of lists, each list representing one portion of said file and having a checksum associated with it that is the macro name for the list, said macro definition file comprising a macro definition for each list that concisely defines a content for each list.

4. The method of claim 3, wherein the macro definition file comprises an idiom dictionary that defines the lists comprising the HTML file cached at the client location.

5. The method of claim 3, further comprising the step of providing a client agent at the client location to extract the macro definition file and the macro name file, said client agent responding to a request entered by a user at the client location to access a site from which the HTML file cached at the client location was obtained, by appending the macro name file for said HTML file after an address for the site, and expanding the macro compressed file that is received from the server location.

6. The method of claim 5, further comprising the step of providing a server agent at the server location to fetch the changed HTML file from the server location and produce the macro compressed file, said macro compressed file comprising the macro name for any list in the changed HTML file that is identical to the list in the HTML file cached at the client location and the list defining any portion of the changed HTML file that differs from that of the HTML file cached at the client location.

7. The method of claim 6, wherein the client agent expands the macro compressed file by replacing macro names included in the macro compressed file with a corresponding content determined from the macro definition file.

8. The method of claim 7, further comprising the step of conveying the new HTML file to a web browser for use in the display at the client location.

9. A system for updating an HTML file disposed at a first location so that it is substantially identical to a changed HTML file disposed at a second location, without transmitting all of the changed HTML file to the first location from the second location, comprising:

(a) a client computer disposed at the first location, said client computer including a display for displaying data, and a memory in which the HTML file is cached and for storing machine instructions that effect a first set of functions;

(b) a communication link coupling the first and the second locations in communication with each other;

(c) a server computer disposed at the second location, said server computer including a memory in which the changed HTML file is stored and for storing machine instructions that implement a second set of functions;

(d) said first set of functions including:
  (i) causing the client computer to extract a macro name file and a macro definition file from the HTML file cached in the memory of the client computer, said macro definition file including a definition that defines a content of at least a portion of the HTML file, and said macro name file including a macro name associated with each said definition;
  (ii) unless macro name file is already available at the server computer, transmitting the macro name file from the client computer to the server computer; and
  (iii) expanding a macro compressed file on the client computer, said macro compressed file being received from the server computer, indicating changes made to the changed HTML file relative to the HTML file cached by the client computer, and including the macro name for each portion of the changed HTML file that is identical to a corresponding portion of the HTML file cached by the client computer, said changes being applied to the HTML file cached in the memory of the client computer to make a new cached HTML file that is substantially identical to the changed HTML file stored in the memory of the server computer, said new cached HTML file being stored in the memory of the client computer; and (e) said second set of functions including:
  (i) causing the server computer to generate the macro compressed file from the changed HTML file using the macro name file, said macro compressed file indicating the changes in the changed HTML file relative the HTML file cached in the memory of the client computer; and
  (ii) causing the server computer to transmit the macro compressed file to the client computer.

10. The system of claim 9, wherein the new cached HTML file is used to produce a displayed image on the display of the client computer at the first location.

11. The system of claim 9, wherein the HTML file cached on the client computer comprises a plurality of lists, each list having a checksum associated with it that is the macro name for the list, said macro name file comprising the macro names for the lists, said macro definition file comprising a macro definition for each list that concisely defines a content for each list.

12. The system of claim 11, wherein the macro definition file comprises an idiom dictionary that defines the lists comprising the HTML file cached in the memory of the client computer.

13. The system of claim 11, wherein the first set of functions effected by the client computer further include producing a client agent on the client computer to extract the macro definition file and the macro name file, said client agent including the macro name file with an address for the second location that is transmitted over the communications link, and expanding the macro compressed file received from the server computer.

14. The system of claim 13, wherein the second set of functions effected by the server computer further include providing a server agent on the server computer to fetch the changed HTML file from the server computer and produce the macro compressed file, said macro compressed file comprising the macro name for any list in the changed HTML file that is identical to the list in the HTML file cached by the client computer, and the compressed file including any portion of the changed HTML file that differs from that of the HTML file cached on the client computer.

15. The system of claim 14, wherein the client agent expands the macro compressed file by replacing macro names included in the macro compressed file with a corresponding content determined from the macro definition file.

16. The system of claim 15, wherein the first set of functions include passing the new HTML file to a web browser for use in displaying an image on the display of the client computer.

17. An article of manufacture for use with a computer, comprising:
  (a) a computer readable memory medium; and
  (b) a plurality of machine instructions stored on said computer readable memory medium, said machine instructions controlling a computer to implement a plurality of functions, said functions including:
    (i) extracting a macro name file and a macro definition file from a cached HTML file;
    (ii) as required, transmitting the macro name file to a different location, said different location storing a changed HTML file; and
    (iii) expanding a macro compressed file received from the different location to recover changes in the changed HTML file, said changes being applied to the cached HTML file to make a new cached HTML file that is substantially identical to the changed HTML file stored at the different location.

18. The article of manufacture of claim 17, wherein the machine instructions cause the new cached HTML file to be used for displaying an image.

19. An article of manufacture for use with a computer, comprising:
  (a) a computer readable memory medium; and
  (b) a plurality of machine instructions stored on said computer readable memory medium, said machine instructions controlling a computer to implement a plurality of functions, said functions including:
    (i) generating a macro compressed file for a changed HTML file using a macro name file derived from a corresponding HTML file that is cached at a different location, said macro compressed file indicating changes in the changed HTML file relative the HTML file cached at the different location; and
    (ii) transmitting the macro compressed file to the different location to enable the cached HTML file to be updated with the changes.

20. The article of manufacture of claim 19, wherein the machine instructions produce the macro compressed file by identifying changes in the changed HTML file relative to the macro name file.

\* \* \* \* \*